(12) United States Patent
Thomas

(10) Patent No.: US 11,936,324 B2
(45) Date of Patent: Mar. 19, 2024

(54) METHOD FOR POSITIONING A MAGNETIC DEVICE

(71) Applicant: Aktiebolaget SKF, Gothenburg (SE)

(72) Inventor: Benedicte Thomas, Ballan-miré (FR)

(73) Assignee: Aktiebolaget SKF, Gothenburg (SE)

( * ) Notice: Subject to any disclaimer, the term of this patent is extended or adjusted under 35 U.S.C. 154(b) by 158 days.

(21) Appl. No.: 17/361,519

(22) Filed: Jun. 29, 2021

(65) Prior Publication Data
US 2022/0014127 A1    Jan. 13, 2022

(30) Foreign Application Priority Data

Jul. 10, 2020   (DE) .................. 102020208675 .3

(51) Int. Cl.
| | | |
|---|---|---|
| *H02P 6/16* | (2016.01) | |
| *G01D 5/14* | (2006.01) | |
| *H02K 29/08* | (2006.01) | |

(52) U.S. Cl.
CPC ............... *H02P 6/16* (2013.01); *G01D 5/14* (2013.01); *G01D 5/142* (2013.01); *H02K 29/08* (2013.01)

(58) Field of Classification Search
None
See application file for complete search history.

(56) References Cited

U.S. PATENT DOCUMENTS

2005/0218884 A1 * 10/2005  Koike ................. F16C 41/007
                                                      324/174
2020/0300941 A1 *  9/2020  Antoku .............. G01D 5/2451

FOREIGN PATENT DOCUMENTS

| WO | 2010/082086 A1 | 7/2010 |
| WO | 2011/070391 A1 | 6/2011 |
| WO | 2014/060040 A1 | 4/2014 |

* cited by examiner

*Primary Examiner* — Patrick Assouad
*Assistant Examiner* — Haidong Zhang
(74) *Attorney, Agent, or Firm* — GARCIA-ZAMOR INTELLECTUAL PROPERTY LAW, LLC; Ruy Garcia-Zamor

(57) ABSTRACT

A method for positioning a magnetic device providing an impulse ring forming a coder and at least three magnetic detection cells forming a magnetic sensor. The impulse ring being provided with a target having pairs of magnetic poles. The number of pair of magnetic poles being counted. The magnetic detection cells are positioned around the target of the impulse ring according to the number of pair of magnetic poles and according to the number of detection cells.

12 Claims, 5 Drawing Sheets

METHOD FOR POSITIONING A MAGNETIC DEVICE

CROSS REFERENCE TO RELATED APPLICATIONS

This application claims priority to German Patent Application no. 102020208675.3, filed Jul. 10, 2020, the contents of which is fully incorporated herein by reference.

TECHNICAL FIELD OF THE INVENTION

The present invention relates to magnetic devices comprising a coder cooperating with magnetic detection cells, and more particularly to methods for positioning the magnetic device.

BACKGROUND OF THE INVENTION

Magnetic devices generally comprise magnetic sensors delivering analogue sine shaped signals related to the rotor angular position. More precisely, such a sensor comprises a rotating part formed out of an impulse ring fitted with magnetic poles and mounted on a bearing and a static part fitted with magnetic detection cells, able to detect the magnetic field of each magnetic pole.

When rotation is applied to the rotor, the magnetic poles pass successively in front of the magnetic detection cells. A voltage is induced within the magnetic detection cells based on its distance to the magnetic poles. The voltage forms a periodic signal, sine shaped, function of time, wherein the intensity of the signal depends on the distance between the magnetic detection cells and the magnetic poles. The time dependency can be converted into an angular dependency based on the known geometry of the sensor and the rotation speed. It is therefore possible to link time with angular position of the rotor and to obtain a sine signal linking intensity with angular position.

Such magnetic sensors are commonly used in motor control. In the particular case of belt starter generators, the requirement on sensor output signals accuracy is more and more important, due to the fact that the machine torque needs to be properly controlled with the least amount of noises. Moreover, the level of oscillating current of the battery must remain under a fixed limit in order to not degrade the overall performances of the vehicle.

Generally, such magnetic sensors comprise tree Hall effect detection cells shifted from each other by an electrical angle of 120° so that the tree magnetic detection cells are positioned on one pair of poles of the impulse ring.

FIG. 1 illustrates schematically a magnetic sensor comprising an impulse ring 1, a first magnetic detection cell 2, a second magnetic detection cell 3, a third magnetic detection cell 4 and a fix referential R comprising an origin O1 confused with the centre of the impulse ring, an horizontal axis X1 and a vertical axis X2 perpendicular to the first axis, the referential R being oriented counter clockwise.

The impulse ring 1 is fitted with 8 north magnetic poles named N1 to N8 alternating with 8 south magnetic poles named S1 to S8 forming 8 pair of poles.

The magnetic detection cells 2, 3, 4 are positioned such that the first cell is on the vertical axis X2, the third cell 4 is shifted by an electrical angle of 120° from the first cell 2 and the second cell 3 is shifted by an electrical angle of 120° from the third cell 4.

Each magnetic detection cell 2, 3, 4 generates a signal V1, V2, V3 representative of the voltage induced within the magnetic detection cells 2, 3, 4.

The signals V1, V2 and V3 are delivered on respectively a first input E1, a second input E2 and a third input E3 of a processing unit PU implementing an algorithm ALGO to compute a frequency diagram of an angle error used to optimize the performances of the vehicle.

The voltages produced by the magnetic detection cells 2, 3, 4 is processed with the Clark transform to compute a sine and cosine signal shifted by 90°.

The determined sine and cosine signal are used to compute the angular position of the rotor with the tangent arc function.

The computed angle is compared with a reference angle, the angle difference being equal to the angle error.

Signal processing operations are performed on the angle error, for example fast Fourier transform algorithm to generate an output signal $\theta_{out}$ on an output S1 of the processing unit PU.

The angle error needs to be minimized to optimize the performance of the vehicle.

The fast Fourier transform of the angle error reveals that the value of the first harmonic of the angle error is too high leading to current oscillations which are above the fixed limit deteriorating prematurely the battery and implying more frequent battery changes.

The documents WO2011070391, WO2014060040 and WO2010082086 describe methods and devices to improve the accuracy of the angular position of the rotor by positioning detections cells.

However, these documents do not deal with the reduction of the first harmonic of the angle error of a position sensor.

Moreover, the proposed positioning of the detection cells requires to modify the algorithm ALGO.

There is a need to avoid at least some of the previously-mentioned drawbacks, especially by reducing the level of harmonics of the induced voltage in the magnetic detection cells of the magnetic sensor while processing the induced voltage without modifying implemented algorithms to process the signals deliver by the magnetic detection cells.

SUMMARY OF THE INVENTION

According to an aspect, a method for positioning a magnetic device is proposed.

The magnetic device comprises an impulse ring forming a coder and at least three magnetic detection cells forming a magnetic sensor, the impulse ring being provided with a target comprising pairs of magnetic poles, the method comprising the step of:

counting the number of pair of magnetic poles, and positioning the target ring of the magnetic detection cells around the impulse ring according to the number of pair of magnetic poles and according to the number of detection cells.

The magnetic sensor may comprise more than three magnetic detection cells.

Advantageously, when the number of pair of poles is not equal to a multiple of the number of magnetic detection cells, the determination of the angular position of the detection cells comprises the step of:

determining a first remainder, the first remainder being equal to $$120 \text{ modulo} \left( \frac{360}{2 \cdot N_{PP1}} \right),$$

$N_{pp1}$ being the number of pair of magnetic poles, determining a second remainder, the second remainder being equal to $$240 \text{ modulo} \left( \frac{360}{2 \cdot N_{PP1}} \right),$$

comparing the first remainder and the second remainder, and determining the angular position of the magnetic detection cells according to the result of the comparison.

Preferably, if the second remainder is greater than the first remainder, a second magnetic detection cell is shifted by 120° from a first magnetic detection cell and the third magnetic detection cell is shifted by 240° from the first magnetic detection cell.

Advantageously, if the first remainder is greater than the second remainder, a third magnetic detection cell is shifted by 120° from a first magnetic detection cell and the second magnetic detection cell is shifted by 240° from the first magnetic detection cell.

Preferably, when the number of magnetic pair of poles is equal to a multiple of the number of magnetic detection cells, the determination of the angular position of the magnetic detection cells comprises the step of:

determining a third remainder, the third remainder being equal to $$\left(120 + \frac{120}{N_{PP2}}\right) \text{ modulo} \left( \frac{360}{2 \cdot N_{PP2}} \right),$$

$N_{PP2}$ being equal to the number of pair of magnetic poles, determining a fourth remainder, the fourth remainder being equal to $$\left(240 + \frac{240}{N_{PP2}}\right) \text{ modulo} \left( \frac{360}{2 \cdot N_{PP2}} \right),$$

comparing the third remainder and the fourth remainder, and determining the angular position of the magnetic detection cells according to the result of the comparison.

Advantageously, if the fourth remainder is greater than the third remainder, a second magnetic detection cell is shifted by $$120° + \frac{120°}{N_{PP2}}$$

from a first magnetic detection cell and the third magnetic detection cell is shifted by $$240° + \frac{240°}{N_{PP2}}$$

from the first magnetic detection cell.

Preferably, if the third remainder is greater than the fourth remainder, a third magnetic detection cell is shifted by $$120° + \frac{120°}{N_{PP2}}$$

from a first magnetic detection cell and the second magnetic detection cell is shifted by $$240° + \frac{240°}{N_{PP2}}$$

from the first magnetic detection cell.

According to another aspect, a sensor bearing unit comprising a first ring and a second ring capable of rotating concentrically relative to one another, an impulse ring secured to the first ring and provided with a target comprising pairs of magnetic poles, and magnetic detection cells positioned around the target of the impulse ring according to a method as defined above is proposed.

BRIEF DESCRIPTION OF THE DRAWINGS

Other advantages and features of the invention will appear on examination of the detailed description of embodiments, in no way restrictive, and the appended drawings in which.

DETAILED DESCRIPTION OF THE INVENTION

In the following, the term "angle" designates a mechanical angle.

Figure 1:
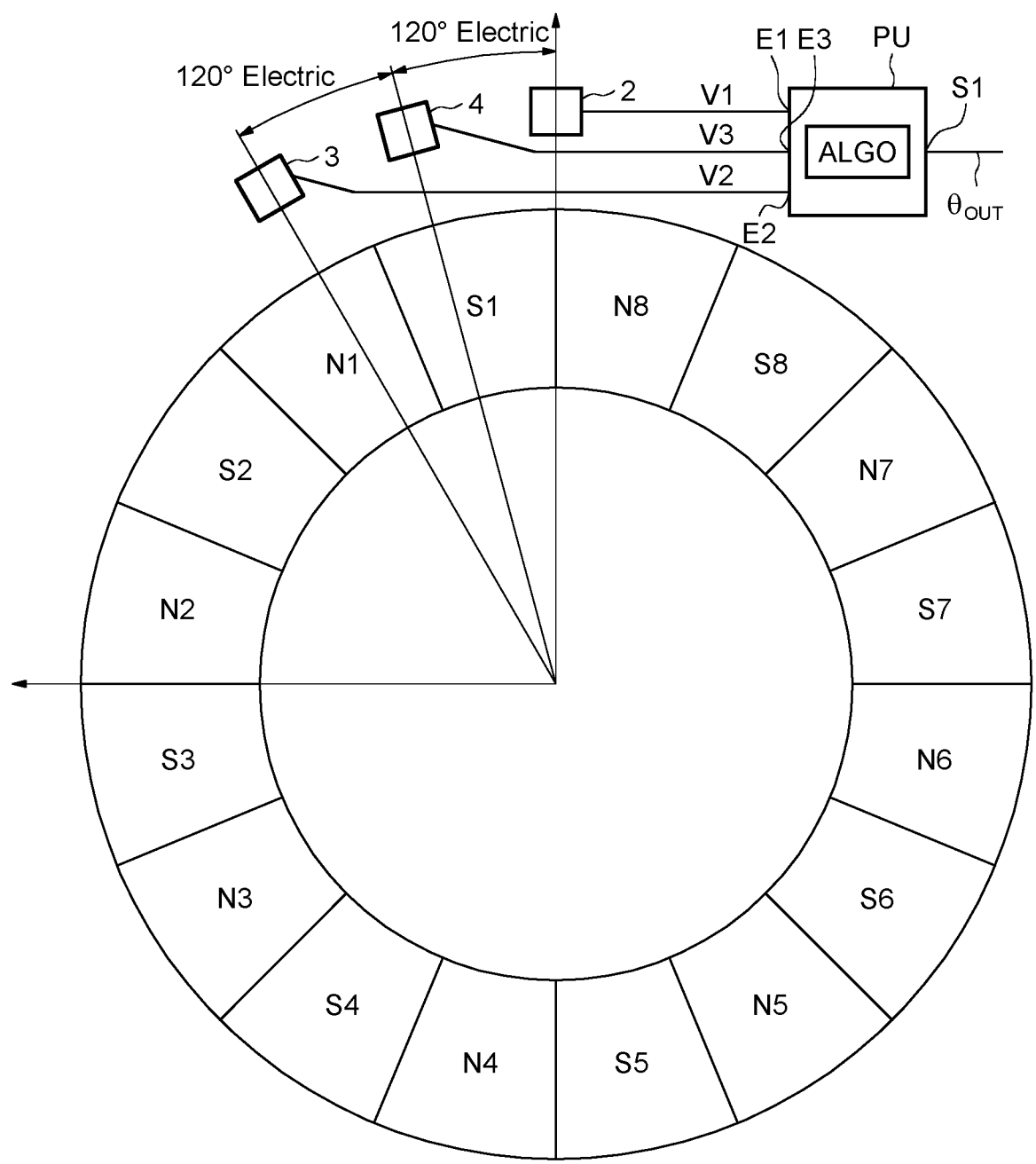
FIG. 1, which has already been mentioned, illustrates schematically a magnetic sensor according to the prior art.
Figure 2:
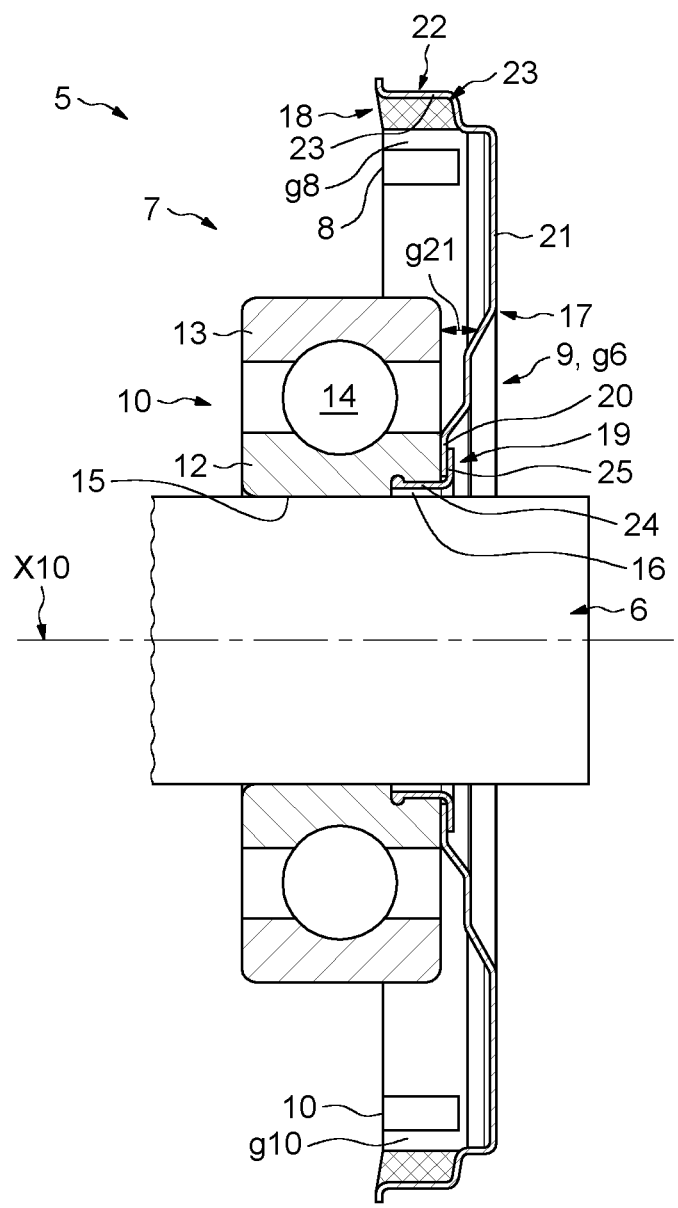
FIG. 2 is an axial section view of a bearing unit according to an example of the invention mounted on a rotating shaft.

Reference is made to FIG. 2 which represents a longitudinal section of a magnetic device 5 comprises a rotating shaft 6, a bearing unit 7 and a first magnetic detection cell 8, a second magnetic detection cell 9, a third magnetic detection cell 10.

The magnetic detection cells 8, 9, 10 are Hall effect magnetic sensors.

The shaft 6 and the bearing unit 7 are centred on a central axis X10 of the magnetic device 5.

The bearing unit 7 comprises a bearing 10 mounted on the shaft 6 and a magnetic impulse ring 11 mounted on the bearing 10.

The magnetic detection cells 8, 9, 10 are associated with the impulse ring 11 for tracking the rotation of the rotating shaft 6.

The bearing 10 includes a rotating inner ring 12 and a non-rotating outer ring 13 centred on axis X10. Bearing 10 also comprises rolling elements 14, for example balls, located between inner ring 12 and outer ring 13.

The inner ring 12 comprises a cylindrical bore 15 and a cylindrical groove 16 made in the bore 15. With reference to axis X10, diameter of the cylindrical bore 15 is smaller than the diameter of the cylindrical groove 16.

The impulse ring 11 includes a target holder 17, a target 18 and a fixing sleeve 19.

Going away from central axis X10, the target holder 17 comprises an inner periphery 20, a radial portion 21 and an outer periphery 22. The inner periphery 20 defines an inner bore of the target holder 17, and is fixed to the rotating inner ring 12 of the bearing 10 by means of the fixing sleeve 19. The radial portion 21 substantially radially extends from the inner periphery 20 towards the exterior of the bearing 10. The outer periphery 22 of the radial portion 21 is located radially beyond the outer ring 13.

A gap g21 is provided axially between the radial portion 21 of the target holder 17 and the lateral face of the outer ring 13.

The outer periphery 22 of the target holder 17 comprises an outer tubular portion 23 that axially extends from the radial portion 21. The outer tubular portion 23 extends parallel to axis X10 and is located radially above the outer ring 13 of bearing 10.

Target 18 is held by the outer tubular portion 23 of the target holder 17, beyond outer ring 13 radially to axis X10 and extends inward the impulse ring 11.

The target 18 and the magnetic detection cells 8, 9, 10 cooperate for tracking the rotation of the impulse ring 11, the target holder 17, the inner ring 12 and the shaft 6 around central axis X10. A gap g8, g9, g10 is provided radially between the outer surface of the target 18 and the detection cells 8, 9, 10.

The target 18 comprises a succession of magnetic poles of opposed polarity such that the magnetic detection cells 8, 9, 10 induce a voltage when the magnetic poles pass successively in front of the detections means.

The inner periphery 20 of the target holder 17 is fixed to the rotating inner ring 12 of the bearing 10 by means of the fixing sleeve 19.

Alternatively, the impulse ring 11 does not include a fixing sleeve, the inner periphery 20 being fixed to the rotating inner ring 12 by other means.

The fixing sleeve 19 comprises an annular tubular portion 24 that axially extends parallel to axis X10.

The tubular portion 24 is fitted in the groove 16 of the rotating inner ring 12.

The fixing sleeve 19 further comprises a radial collar 25 that radially outwardly extends from an end of the annular tubular portion 24.

The radial collar 25 is overlapping the inner periphery 20 of radial extension of the target holder 17. The inner periphery 20 is axially pressed by the radial collar 25 onto the lateral face of inner ring 12 so as to prevent any relative rotation between the fixing sleeve 19, the target holder 17 and the inner ring 12.

The magnetic detection cells 8, 9, 10 are positioned inside and around the impulse ring 11 according to the number of pair of poles and according to the number of detection cells.

The impulse ring 11 forms a coder and the magnetic detection cells 8, 9, 10 form of a magnetic sensor.

Figure 3:
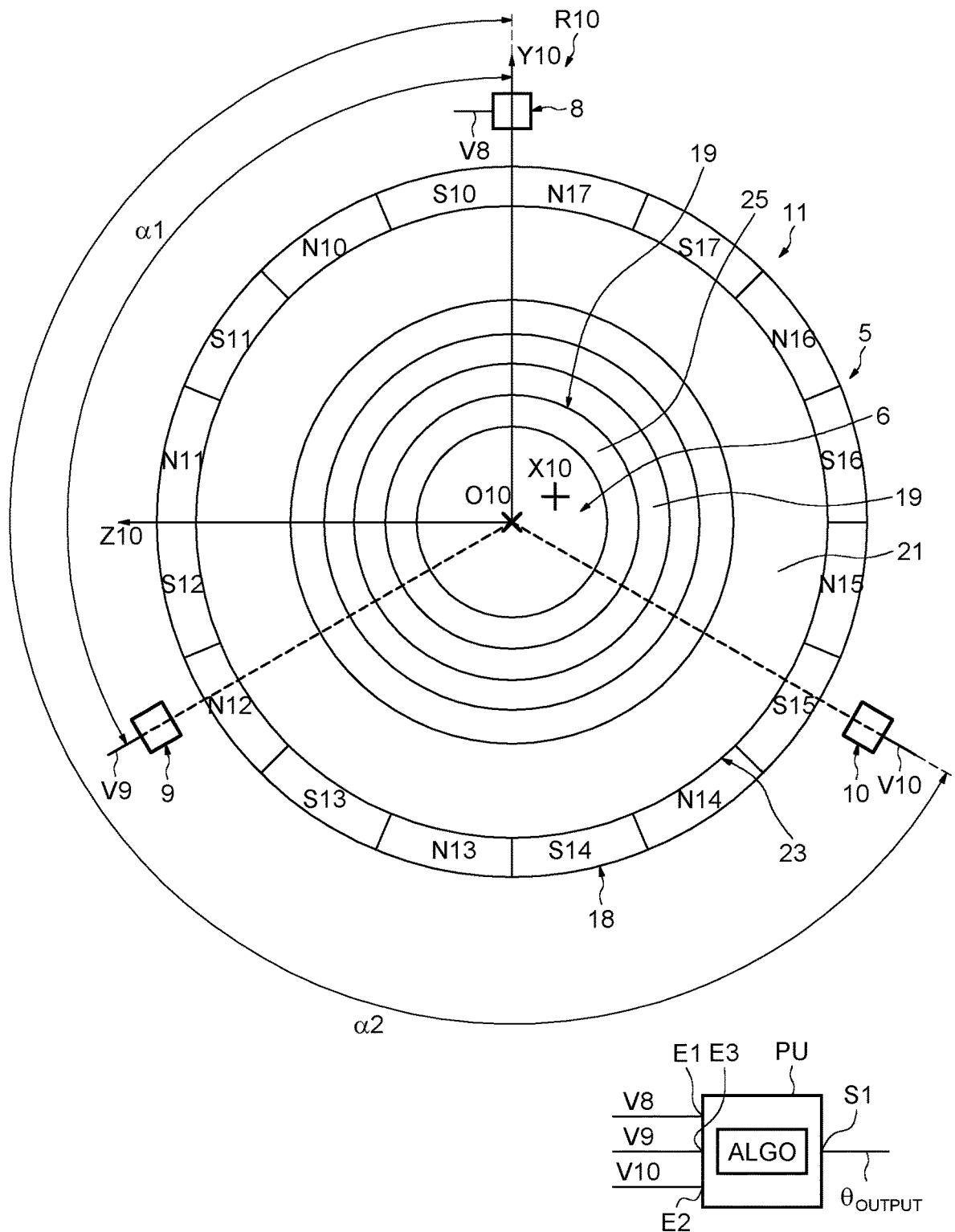
FIG. 3 illustrates schematically a first embodiment of an impulse ring.

FIG. 3 represents schematically a first example of an embodiment of the impulse ring 11 mounted on the shaft 6 and the magnetic detection cells 8, 9, 10.

The target 18 comprises for example 8 north magnetic poles named N10 to N17 alternating with 8 south magnetic poles named S10 to S17 forming 8 pair of poles denoted $N_{pp1}$.

In another embodiment, the impulse ring 11 comprises more or less than 8 pair of poles, the number $N_{pp1}$ of pair of poles being not equal to a multiple of the number $N_{cell}$ of magnetic detection cells 8, 9, 10.

A referential R10 comprising an origin O10 confused with the centre X10 of the axis 6, a vertical axis Y10 and a horizontal axis Z10 perpendicular to the vertical axis Y10 is defined. The referential R10 is oriented counter clockwise.

The first detection cell 8 is lined up on the vertical axis, the second detection cell 9 is shifted by an oriented angle α1 from the first cell 8 and the third detection cell 10 is shifted by an oriented angle α2 from the first cell 8.

Each magnetic detection cell 8, 9, 10 generates an angular signal V8, V9, V10 representative of the induced voltage within the magnetic detection cell which is for example process by the processing unit PU comprising the algorithm ALGO to determine frequency diagram of the angle error used to optimize for example the performances of a vehicle and more particularly the performance of a battery of the vehicle.

The signals V8, V9 and V10 are delivered on respectively the first input E1, the second input E2 and the third input E3 of the processing unit PU so that the algorithm ALGO can process the signals the signals V8, V9 and V10 generated by the magnetic detection cells 8, 9 and 10 positioned differently than the magnetic detection cells of the prior art such that no modification of the algorithm ALGO is required.

An output signal θoutput representative of the frequency spectrum of the angle error is delivered on the output S1 of the processing unit UT.

In other embodiments, the algorithm ALGO implements others signal processing methods.

Figure 4:
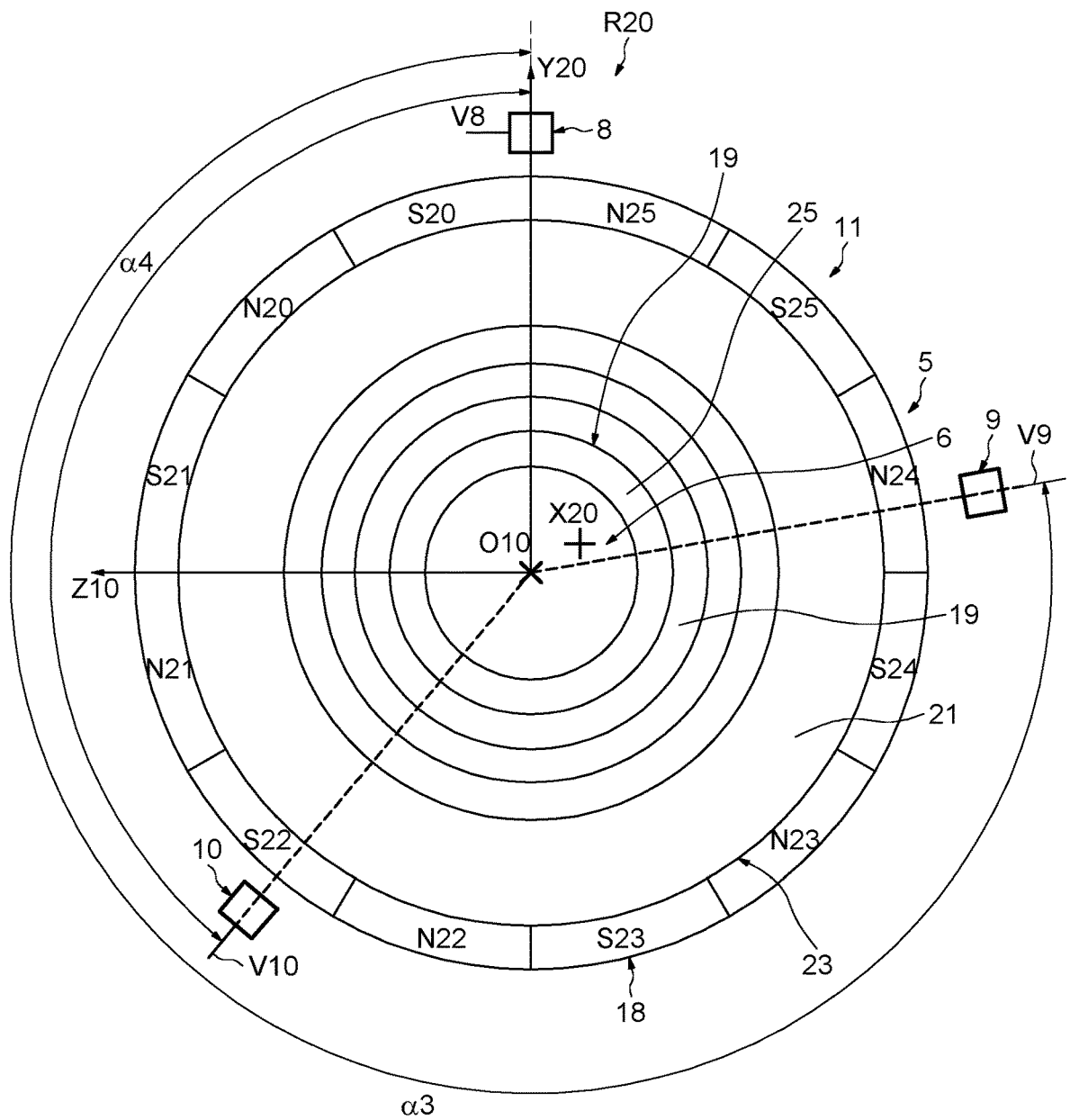
FIG. 4 illustrates schematically a second embodiment of an impulse ring.
Figure 4:
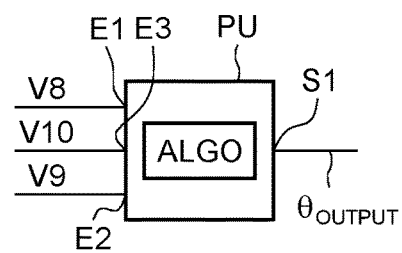

FIG. 4 represents schematically a second example of an embodiment of the impulse ring 11 mounted on the shaft 6 and the magnetic detection cells 8, 9, 10.

The target 18 comprises for example 6 north magnetic poles named N20 to N25 alternating with 6 south magnetic poles named S20 to S25 forming 6 pair of poles denoted $N_{pp2}$.

In another embodiment, the impulse ring 11 comprises more or less than 6 pair of poles, the number the number $N_{pp2}$ of pair of poles being equal to a multiple of the number $N_{cell}$ of detection cells 8, 9, 10.

A referential R20 comprising an origin O20 confused with the centre X20 of the axis 6, a vertical axis Y20 and a horizontal axis X20 perpendicular to the first axis Y20 is defined. The referential R20 is oriented counter clockwise.

The first detection cell 8 is lined up on the vertical axis Y20, the second detection cell 9 is shifted by an oriented angle α3 from the first cell 8 and the third detection cell 10 is shifted by an oriented angle α4 from the first cell 8.

The signals V8, V9 and V10 are delivered on respectively the first input E1, the third input E3 and the second input E2 of the processing unit PU so that the algorithm ALGO can process the signals the signals V8, V9 and V10 generated by the magnetic detection cells 8, 9 and 10 positioned differently than the magnetic detection cells of the prior art such that no modification of the algorithm ALGO is required.

The output signal θoutput representative of the frequency spectrum of the angle error is delivered on the output S1 of the processing unit UT.

The determination of the oriented angles α1, α2, α3 and α4 is explained in the following.

Figure 5:
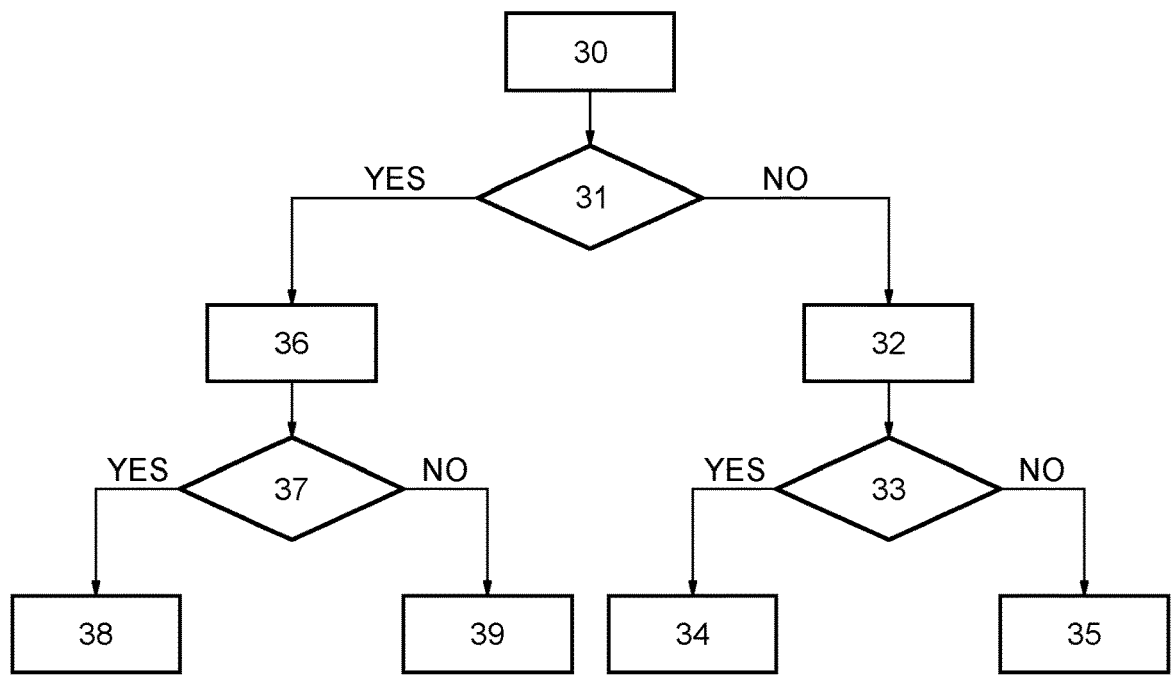
FIG. 5 illustrates an embodiment of a method for positioning the magnetic device according to the invention.

FIG. 5 represents an example of an embodiment of a method for positioning the magnetic device 5.

In a step 30, the number of pair of poles of the impulse ring 11 is counted.

If the number of pair of poles is not equal to a multiple of the number $N_{cell}$ of detection cells (step 31) as in the first embodiment of the impulse ring 11 shown in FIG. 3 comprising $N_{pp1}$ pair of poles equal to 8, then in step 32, the determination of the angular position of the detection cells 8, 9, 10 comprises:

the determination of a first remainder, the first remainder being equal to $$120 \text{ modulo} \left( \frac{360}{2 \cdot N_{PP1}} \right),$$

and the determination of a second remainder REM2, the second remainder being equal to $$240 \text{ modulo} \left( \frac{360}{2 \cdot N_{PP1}} \right).$$

If the second remainder REM2 is greater than the first remainder REM1 (step 33), than at step 34, the second magnetic detection cell 9 is shifted by 120° from the first magnetic detection cell 8 and the third magnetic detection cell 10 is shifted by 240° from the first detection cell 8.

If the first remainder REM1 is greater than the second remainder REM2 (step 33), than at step 35, the third magnetic detection cell 10 is shifted by 120° from the first magnetic detection cell 8 and the second magnetic detection cell 9 is shifted by 240° from the first magnetic detection cell 8.

In the first embodiment of the impulse ring 11, the first remainder REM1 is equal to 7.5 and the second remainder REM2 is equal to 15 so that the second detection cell 9 is shifted by the oriented angle α1 equal to 120° from the first cell 8 and the third detection cell 10 is shifted by the oriented angle α2 equal to 240° from the first cell 8 (step 33).

If the number of pair of poles is equal to a multiple of the number $N_{cell}$ of detection cells (step 31) as in the second embodiment of the impulse ring 11 shown in FIG. 4 comprising $N_{pp2}$ pair of poles equal to 6, then in step 36, the determination of the angular position of the magnetic detection cells 8, 9, 10 comprises:

the determination of a third remainder REM3, the third remainder being equal to $$\left( 120 + \frac{120}{N_{PP2}} \right) \text{modulo} \left( \frac{360}{2 \cdot N_{PP2}} \right),$$

and the determination of a fourth remainder REM4, the fourth remainder being equal to $$\left( 240 + \frac{240}{N_{PP2}} \right) \text{modulo} \left( \frac{360}{2 \cdot N_{PP2}} \right).$$

If the fourth remainder REM4 is greater than the third remainder REM3 (step 37), then in step 38, the second magnetic detection cell 9 is shifted by $$120° + \frac{120°}{N_{PP2}}$$

from the first magnetic detection cell 8 and the third magnetic detection cell 10 is shifted by $$240° + \frac{240°}{N_{PP2}}$$

from the first detection cell 8.

If the third remainder REM3 is greater than the fourth remainder REM4 (step 37), than at step 39, the third magnetic detection cell 10 is shifted by $$120° + \frac{120°}{N_{PP2}}$$

from the first magnectic detection cell 8 and the second magnetic detection 9 cell is shifted by $$240° + \frac{240°}{N_{PP2}}$$

from the first magnetic detection cell 8.

In the second embodiment of the impulse ring 11, the third remainder REM3 is equal to 20 and the fourth remainder REM4 is equal to 10 so that the third magnetic detection cell 10 is shifted by the oriented angle α4 equal to 140° from the first magnetic detection cell 8 and the second magnetic detection 9 cell is shifted by the oriented angle α3 equal to 280° from the first magnetic detection cell 8.

Figure 6:
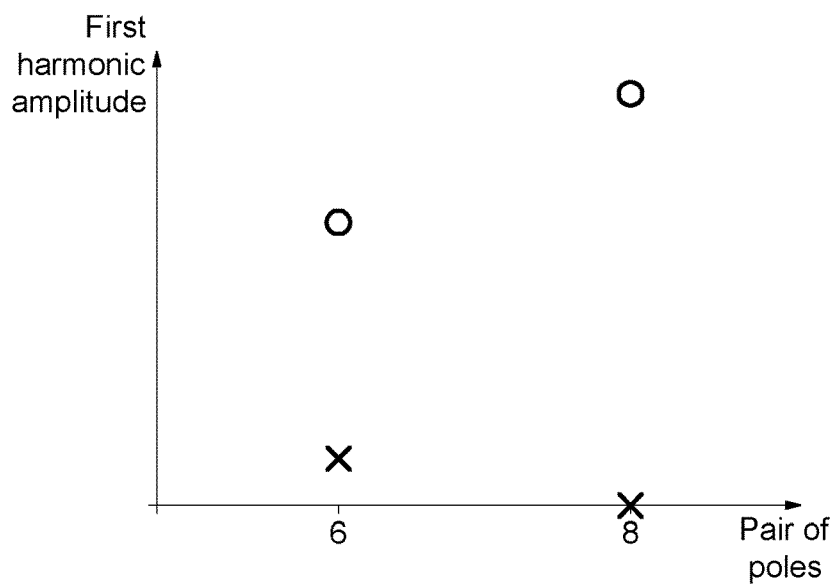
FIG. 6 illustrates the amplitude of the first harmonic according to the number of pair of poles.

FIG. 6 represents the amplitude of the first harmonic according to the number of pair of poles.

The rounded points represent the amplitude of the first harmonic according to the positioning of the magnetic detection cells in the prior art and the cross points represent the amplitude of the first harmonic according to the positioning of the magnetic detection cells 8, 9, 10 for 6 and 8 pair of poles.

The amplitude of the first harmonic for 6 and 8 pair of poles is dramatically reduced.

The method permits to highly reduce the amplitude of the first harmonic so that for example the current oscillations of the battery are below the critical limit improving the lifetime of the battery.

The signals delivered by the magnetic detection cells are processed by the algorithm ALGO, no modifications of the algorithm ALGO being required.

The positioning of the magnetic detection cells around the impulse ring allows to compensate the concentricity defects of the rotor and the stator without hard turning or without restraining the tolerances on the apparatus.

In the illustrated example, the sensor bearing unit is provided with a rolling bearing comprising one row of rolling elements. Alternatively, the rolling bearing may comprise at least two rows of rolling elements. In the illustrated example, the rolling elements are balls. Alternatively, the rolling bearing may comprise other types of rolling elements, for example rollers. In another variant, the rolling bearing may also be provided with a sliding bearing having no rolling elements.

Otherwise, in this illustrated example, the first ring of the rolling bearing is the inner ring 12 whereas the second ring is the outer ring 13. As an alternative, it could be possible to provide a reversed arrangement with the first ring forming the outer ring and the second ring forming the inner ring. In this case, the impulse ring is secured to the outer ring.

In the illustrated example, the magnetic poles extend inward the impulse ring 11, the detection cells 8, 9 and 10 being positioned inside the impulse ring 11.

Alternatively, the magnetic poles may be fixed on the outer periphery 22 of the impulse ring 11 so that the magnetic poles extend outward the impulse ring 11, the detection cells 8, 9 and 10 being positioned outside and around the impulse ring 11 according to the number of pair of poles and according to the number of detection cells.

The invention claimed is:

1. A method for positioning a magnetic device comprising:
   providing an impulse ring forming a coder and at least three magnetic detection cells forming a magnetic sensor, the impulse ring having a target comprising pairs of magnetic poles, and
   positioning the magnetic detection cells around the target of the impulse ring according to a number of pairs of magnetic poles and according to the number of detection cells,
   wherein when the number of pairs of magnetic poles is not equal to a multiple of the number of magnetic detection cells, the determination of the angular position of the detection cells further comprises the steps of:
   determining a first remainder, the first remainder being equal to $$120 \text{ modulo} \left( \frac{360}{2 \cdot N_{PP1}} \right),$$

$Npp_1$ being the number of pairs of magnetic poles,
   determining a second remainder, the second remainder being equal to $$240 \text{ modulo} \left( \frac{360}{2 \cdot N_{PP1}} \right),$$

comparing the first remainder and the second remainder, and
   determining the angular position of the magnetic detection cells according to the result of the comparison.

2. The method according to claim 1, wherein if the second remainder is greater than the first remainder, a second magnetic detection cell is shifted by 120° from a first magnetic detection cell and the third magnetic detection cell is shifted by 240° from the first magnetic detection cell.

3. The method according to claim 1, wherein if the first remainder is greater than the second remainder, a third magnetic detection cell is shifted by 120° from a first magnetic detection cell and the second magnetic detection cell is shifted by 240° from the first magnetic detection cell.

4. A method for positioning a magnetic device comprising:
   providing an impulse ring forming a coder and at least three magnetic detection cells forming a magnetic sensor, the impulse ring having a target comprising pairs of magnetic poles, and
   positioning the magnetic detection cells around the target of the impulse ring according to a number of pairs of magnetic poles and according to the number of detection cells,
   wherein when the number of pairs of magnetic poles is equal to a multiple of the number of magnetic detection cells, the determination of the angular position of the magnetic detection cells further comprises the steps of:
   determining a third remainder, the third remainder being equal to $$\left(120 + \frac{120}{N_{PP2}}\right) \text{ modulo} \left( \frac{360}{2 \cdot N_{PP2}} \right),$$

$Npp_2$ being the number of pairs of magnetic poles,
   determining a fourth remainder, the fourth remainder being equal to $$\left(240 + \frac{240}{N_{PP2}}\right) \text{ modulo} \left( \frac{360}{2 \cdot N_{PP2}} \right),$$

comparing the third remainder and the fourth remainder, and
   determining the angular position of the magnetic detection cells according to the result of the comparison.

5. The method according to claim 4, wherein if the fourth remainder is greater than the third remainder, a second magnetic detection cell is shifted by $$120° + \frac{120°}{N_{PP2}}$$

from a first magnetic detection cell and the third magnetic detection cell is shifted by $$240° + \frac{240°}{N_{PP2}}$$

from the first magnetic detection cell.

6. The method according to claim 4, wherein if the third remainder is greater than the fourth remainder, a third magnetic detection cell is shifted by $$120° + \frac{120°}{N_{PP2}}$$

from a first magnetic detection cell and the second magnetic detection cell is shifted by $$240° + \frac{240°}{N_{PP2}}$$

from the first magnetic detection cell.

7. A method for positioning a magnetic device comprising:

provide an impulse ring forming a coder and exactly three magnetic detection cells forming a magnetic sensor, the impulse ring having a target comprising pairs of magnetic poles, and positioning the magnetic detection cells around the target of the impulse ring according to a number of pairs of magnetic poles and according to the number of detection cells, wherein when the number of pairs of magnetic poles is not equal to a multiple of the number of magnetic detection cells, the determination of the angular position of the detection cells further comprises the steps of:

determining a first remainder, the first remainder being equal to $$120 \text{ modulo} \left(\frac{360}{2 \cdot N_{PP1}}\right),$$

$Npp_1$ being the number of pairs of magnetic poles, determining a second remainder, the second remainder being equal to $$240 \text{ modulo} \left(\frac{360}{2 \cdot N_{PP1}}\right),$$

comparing the first remainder and the second remainder, and determining the angular position of the magnetic detection cells according to the result of the comparison.

8. The method according to claim 7, wherein if the second remainder is greater than the first remainder, a second magnetic detection cell is shifted by 120° from a first magnetic detection cell and the third magnetic detection cell is shifted by 240° from the first magnetic detection cell.

9. The method according to claim 7, wherein if the first remainder is greater than the second remainder, a third magnetic detection cell is shifted by 120° from a first magnetic detection cell and the second magnetic detection cell is shifted by 240° from the first magnetic detection cell.

10. The method according to claim 7, wherein when the number of pairs of magnetic poles is equal to a multiple of the number of magnetic detection cells, the determination of the angular position of the magnetic detection cells further comprises the steps of:

determining a third remainder, the third remainder being equal to $$\left(120 + \frac{120}{N_{PP2}}\right) \text{ modulo} \left(\frac{360}{2 \cdot N_{PP2}}\right),$$

$Npp_2$ being the number of pairs of magnetic poles, determining a fourth remainder, the fourth remainder being equal to $$\left(240 + \frac{240}{N_{PP2}}\right) \text{ modulo} \left(\frac{360}{2 \cdot N_{PP2}}\right),$$

comparing the third remainder and the fourth remainder, and determining the angular position of the magnetic detection cells according to the result of the comparison.

11. The method according to claim 10, wherein if the fourth remainder is greater than the third remainder, a second magnetic detection cell is shifted by $$120° + \frac{120°}{N_{PP2}}$$

from a first magnetic detection cell and the third magnetic detection cell is shifted by $$240° + \frac{240°}{N_{PP2}}$$

from the first magnetic detection cell.

12. The method according to claim 10, wherein if the third remainder is greater than the fourth remainder, a third magnetic detection cell is shifted by $$120° + \frac{120°}{N_{PP2}}$$

from a first magnetic detection cell and the second magnetic detection cell is shifted by $$240° + \frac{240°}{N_{PP2}}$$

from the first magnetic detection cell.

* * * * *